US012025913B2

(12) United States Patent
Kim et al.

(10) Patent No.: US 12,025,913 B2
(45) Date of Patent: Jul. 2, 2024

(54) METHODS OF MAKING A BONDED ASSEMBLY AND A RE-ENTRANT STRUCTURE, AND METHOD OF TRANSFER PRINTING A MASKING LAYER

(71) Applicant: The Board of Trustees of the University of Illinois, Urbana, IL (US)

(72) Inventors: Seok Kim, Champaign, IL (US); Hohyun Keum, Champaign, IL (US); Jun Kyu Park, Champaign, IL (US)

(73) Assignee: THE BOARD OF TRUSTEES OF THE UNIVERSITY OF ILLINOIS, URBANA, IL (US)

( * ) Notice: Subject to any disclaimer, the term of this patent is extended or adjusted under 35 U.S.C. 154(b) by 234 days.

(21) Appl. No.: 17/670,070

(22) Filed: Feb. 11, 2022

(65) Prior Publication Data

US 2022/0163883 A1     May 26, 2022

Related U.S. Application Data

(62) Division of application No. 16/515,431, filed on Jul. 18, 2019, now Pat. No. 11,281,096.

(60) Provisional application No. 62/700,455, filed on Jul. 19, 2018.

(51) Int. Cl.
| | |
|---|---|
| *B32B 3/26* | (2006.01) |
| *G03F 7/00* | (2006.01) |
| *G03F 7/038* | (2006.01) |
| *B82Y 10/00* | (2011.01) |
| *B82Y 40/00* | (2011.01) |

(52) U.S. Cl.
CPC ............ *G03F 7/0002* (2013.01); *G03F 7/038* (2013.01); *B82Y 10/00* (2013.01); *B82Y 40/00* (2013.01)

(58) Field of Classification Search
None
See application file for complete search history.

(56) References Cited

U.S. PATENT DOCUMENTS

| | | |
|---|---|---|
| 8,057,891 B2 | 11/2011 | Cheng et al. |
| 8,093,340 B2 | 1/2012 | Xie et al. |
| 8,236,129 B2 | 8/2012 | Xie et al. |
| 8,237,324 B2 | 8/2012 | Pei et al. |
| 8,251,163 B2 | 8/2012 | Xie et al. |
| 8,480,942 B2 | 7/2013 | Shannon |
| 8,628,838 B2 | 1/2014 | Xie et al. |

(Continued)

OTHER PUBLICATIONS

A. del Campo and C. Greiner, "Topical Review—SU-8: a photoresist for high-aspect-ratio and 3D submicron lithography", J. Micromech. Microeng., 17 (2007) R81-R95. (Year: 2007).*

(Continued)

*Primary Examiner* — Alexander S Thomas
(74) *Attorney, Agent, or Firm* — Crowell & Moring LLP (57) ABSTRACT

A method of making a bonded polymeric assembly by transfer printing comprises contacting a stamp with a solid-phase ink comprising a photoresist to form an inked stamp, where the solid-phase ink is reversibly bound to the stamp. The inked stamp is aligned with an object comprising the photoresist and is stamped onto the object. The stamp is then removed, thereby transferring the solid-phase ink onto the object. The solid-phase ink is thermally joined with the object. Thus, a bonded polymeric assembly comprising a bonded joint between the solid-phase ink and the object is formed.

22 Claims, 6 Drawing Sheets

(56) References Cited

U.S. PATENT DOCUMENTS

| | | | |
|---|---|---|---|
| 8,685,528 | B2 | 4/2014 | Xie et al. |
| 2010/0123268 | A1 | 5/2010 | Menard |
| 2013/0069275 | A1 | 3/2013 | Menard et al. |
| 2013/0344601 | A1* | 12/2013 | Soman ............. A61L 27/14 264/401 |
| 2014/0069578 | A1 | 3/2014 | Xie et al. |
| 2015/0136318 | A1 | 5/2015 | Tiefel |
| 2015/0352586 | A1 | 12/2015 | Kim et al. |
| 2015/0359043 | A1 | 12/2015 | Kim et al. |

OTHER PUBLICATIONS

Allen, M. G. & Senturia, S. D., "Analysis of Critical Debonding Pressures of Stressed Thin Films in the Blister Test," *J. Adhesion*, 25, 303-315 (1988).

Anetsberger, G. et al., "Measuring Nanomechanical Motion With an Imprecision Below the Standard Quantum Limit," *Phys. Rev. A*, 82, 061804 (2010).

Armani, D. K., Kippenberg, T. J., Spillane, S. M. & Vahala, K. J., "Ultra-High-Q Toroid Microcavity on a Chip," *Nature*, 421, 925-928 (2003).

Ayón, A. A. et al., "Characterization of Silicon Wafer Bonding for Power MEMS Applications," *Sensors and Actuatuators A*, 103, 1-8 (2003).

Berger, M., "Microfabrication Inspired by Lego," *NanoWerk* (2013) pp. 1-3.

Bhaswara, A. et al., "Fabrication of Nanoplate Resonating Structures via Micro-Masonry," *J. Micromech. Microeng*, 24, 115012 (2014).

Bhaswara, A. et al., "A Simple Fabrication Process Based on Micro-Masonry for the Realization of Nanoplate Resonators with Integrated Actuation and Detection Schemes," *Frontiers in Mechanical Engineering*, vol. 2, Article 1, 1-7 (Mar. 2016).

Brown, P.S., et al., "Durable, superoleophobic polymer-nanoparticle composite surfaces with re-entrant geometry via solvent-induced phase transformation," *Scientific Reports*, 6, 21048 (2016), 11 pages.

Carlson, Andrew et al., "Active, Programmable Elastomeric Surfaces with Tunable Adhesion for Deterministic Assembly by Transfer Printing," *Advanced Functional Materials*, 22 (2012), pp. 4476-4484.

Carlson, Andrew, "Advanced Stamp Geometries and Adhesiveless Transfer Printing Modalities for use in Deterministic Materials Assembly" Ph.D. Thesis, *University of Illinois at Urbana-Champaign* (2012), 287 pages.

Cassie, A. B. D., et al., "Wettability of Porous Surfaces," *Trans Faraday Soc.*, 40 (1944), pp. 546-551.

Choi, Jaeho, et al., "Direct Fabrication of Micro/Nano-Patterned Surfaces by Vertical-Directional Photofluidization of Azobenzene Materials," *ACS Nano*, 11 (2017), pp. 1320-1327.

Debaes, C., et al., "Low-cost Micro-optical Modules for Board Level Optical Interconections," *IEEE LEOS Newsletter*, 19 (2005), pp. 12-14.

Dechev, Nikolai et al., "Microassembly of 3-D Microstructures Using a Compliant, Passive Microgripper," *Journal of Microelectromechanical Systems*, 13, 2 (Apr. 2004), pp. 176-189.

Do, Mai Trang, et al., "Submicrometer 3D structures fabrication enabled by one-photon absorption direct laser writing," *Optics Express*, 21, 18 (2013), 10 pages.

Doll, A., Rabold, M., Goldschmidtboing, F. & Woias, P., "Versatile Low Temperature Wafer Bonding and Bond Strength Measurement by a Blister Test Method," *Microsyst. Technol.*, 12, 418-429 (2006).

Eisenhaure, J., "Microstructured Shape Memory Polymer Surfaces with Reversible Dry Adhesion," *ACS Appl. Mater. Interfaces*, 5 (2013) pp. 7714-7717.

Eisenhaure, J. et al., "Microstructured Shape Memory Polymer Surfaces with Reversible Adhesion," *Presentation from International Mechanical Engineering Conference & Exposition (IMECE) in Houston, TX*, Nov. 13, 2012, pp. 1-15.

Eisenhaure, J. et al., "Microstructured Shape Memory Polymer Surfaces with Reversible Adhesion," *Presentation from Materials Research Society (MRS) Fall Meeting in Boston, MA*, Nov. 28, 2012, pp. 1-11.

Eisenhaure, J. et al., "Aphid Foot Inspired Reversible Dry Adhesives," *Abstract from 2012 MRS Fall Meeting in Boston, MA*, Nov. 28, 2012, 1 page.

Eisenhaure, J. et al., "Micro-Structured Shape Memory Polymer Based Stamps with Controllable Adhesion," *Abstract from ASME 2012 International Mechanical Engineering Congress & Exposition (IMECE) in Houston, TX*, Nov. 9-15, 2012, 1 page.

Eisenhaure, J. et al., "The Use of Shape Memory Polymers for MEMS Assembly," *Journal of Microelectromechanical Systems*, vol. 25, No. 1, Feb. 2016 pp. 69-77 (9 pages).

Haliyo, D. Sinan et al., "Advanced applications using [mü]MAD, the adhesion based dynamic micro-manipulator," *Proceedings of the 2003 IEEE/ASME International Conference on Advanced Intelligent Mechatronics* (AIM 2003), pp. 880-885.

Harsh, K. F., Su, B., Zhang, W., Bright, V. M. & Lee, Y. C., "The Realization and Design Considerations of a Flip-Chip Integrated MEMS Tunable Capacitor," *Sensors and Actuators*, 80, 108-118 (2000).

Jeong, J. W. et al., "Two-Axis MEMS Scanner With Transfer-Printed High-Reflectivity, Broadband Monolithic Silicon Photonic Crystal Mirrors," *Opt. Express*, 21, 13800-13809 (2013).

Judy, J., "Microelectromechanical Systems (MEMS): Fabrication, Design And Applications," *Smart Mater. Struct.*, 10, 1115-1134 (2001).

Keum, Hohyun, et al., "Electrical Contact at the Interface Between Silicon and Transfer-Printed Gold Films by Eutectic Joining," *ACS Applied Materials & Interfaces*, (2013) 6061-6065.

Keum, Hohyun, et al., "Micro-Masonry for 3D Additive Micromanufacturing," *Journal of Visualized Experiments*, 90 (Aug. 2014), 7 pages.

Keum, Hohyun et al., "Silicon Micro-Masonry Using Elastomeric Stamps For Three-Dimensional Microfabrication," *Journal of Micromechanics and Microengineering*, 22 (2012) 055018 (7 pp).

Keum, H., Chung, H.-J. & Kim, S., "Electrical Contact at the Interface Between Silicon and Transfer-Printed Gold Films by Eutectic Joining," *ACS Appl. Mater. Interfaces* 5, 13 (2013) pp. 6061-6065.

Keum, Hohyun, et al., "Microassembly of Heterogeneous Materials using Transfer Printing and Thermal Processing," *Scientific Reports*, 6, 29925 (2016) 9 pages.

Kim, S. et al., "Microstructured elastomeric surfaces with reversible adhesion and examples of their use in deterministic assembly by transfer printing," *PNAS*, 107, 40 (2010) pp. 17095-17100.

Kim, S., et al., "Reversible Dry Micro-Fibrillar Adhesives with Thermally Controllable Adhesion," *Soft Matter*, 5 (2009) pp. 3689-3693.

Kim, Seok, et al., "Wet Self-Cleaning of Biologically Inspired Elastomer Mushroom Shaped Microfibrillar Adhesives," *Langmuir*, 25, 13 (2009), pp. 7196-7199.

Kim, Seok, "LEGO-like microassembly using reversible dry adhesion," *IEEE Potentials*, 35, 4 (2016), pp. 14-17.

Kim, Seok et al., "Enhanced adhesion with pedestal-shaped elastomeric stamps for transfer printing," *Applied Physics Letters*, 100 (2012), pp. 171909-1-171909-4 (4 pages).

Kippenberg, T. J. & Vahala, K. J., "Cavity Optomechanics: Back-Action at the Mesoscale," *Science*, 321, 1172-1176 (2008).

Knight, J. C., Cheung, G., Jacques, F. & Birks, T. A., "Phase-Matched Excitation of Whispering-Gallery-Mode Resonances by a Fiber Taper," *Opt. Lett.*, 22, 1129-1131 (1997).

Kwon, Min Ho, et al., "Fabrication of a super-hydrophobic surface on metal using laser ablation and electrodeposition," *Applied Surface Science*, 288 (2014), pp. 222-228.

Lee, Hyukjae, et al., "Nanoindentation technique for characterizing cantilever beam style RF microelectromechanical systems (MEMS) switches," *Journal of Micromechanics and Microengineering*, 15, 6 (2005), pp. 1230-1235.

Lee, Sangkyu, et al., "LEGO-like assembly of peelable, deformable components for integrated devices," *NPG Asia Materials*, 5 (2013), 7 pages.

(56) References Cited

OTHER PUBLICATIONS

Lin, L., "MEMS Post-Packaging by Localized Heating and Bonding," *IEEE Trans. Adv. Packag.*, 23, 608-616 (2000).
Liu, Tingyi, et al., "Turning a surface superrepellent even to completely wetting liquids," *Science*, 346, 6213 (2014), pp. 1096-1100.
Lorenz, H. et al., "SU-8: a low-cost negative resist for MEMS," *Journal of Micromechanics and Microengineering*, 7 (1997), pp. 121-124.
Lu, Y., Huang, J. Y., Wang, C., Sun, S. & Lou, J., "Cold Welding of Ultrathin Gold Nanowires," *Nat. Nanotechnol.*, 5, 218-224 (2010).
Mastrangeli, Massimo, "The Fluid Joint: The Soft Spot of Micro- and Nanosystems," *Adv. Mater.*, 27, 4254-4272 (2015).
Maszara, W. P., "Silicon-On-Insulator by Wafer Bonding: A Review," *J. Electrochem. Soc.*, 138, 341-347 (1991).
Maszara, W. P., "Silicon-On-Insulator by Wafer Bonding: A Review," *J. Electrochem. Soc.*, 138, 1 (1991), pp. 341-347.
Meitl, Matthew A et al., "Transfer Printing by Kinetic Control of Adhesion to an Elastomeric Stamp," *Nature Materials*, 5 (Jan. 2006), pp. 33-38.
Mengüç, Yiğit et al., "Gecko-Inspired Controllable Adhesive Structures Applied to Micromanipulation," *Advanced Functional Materials*, 22 (2012) pp. 1246-1254.
Milanovic, V., Maharbiz, M. & Pister, K. S. J., "Batch Transfer Integration of RF Microrelays," *IEEE Microw. Guided Wave Lett.*, 10, 313-315 (2000).
Ning, Hailong, et al., "Transfer-Printing of Tunable Porous Silicon Microcavities with Embedded Emitters," *ACS Photonics*, 1 (2014), 1144-1150.
Oh, Dong-Wook, et al., "Interfacial Thermal Conductance of Transfer-Printed Metal Films," *Advanced Materials*, 23 (2011), pp. 5028-5033.
Pimpin, Alongkorn, "Review on Micro- and Nanolithography Techniques and their Applications," *Engineering Journal*, 16, 1 (2012), pp. 37-55.
Sariola, Veikko, et al., "Hybrid microhandling: a unified view of robotic handling and self-assembly," *J. Micro-Nano Mech.*, 4 (2008), pp. 5-16.
Spillane, S. M., Kippenberg, T. J. & Vahala, K. J., "Ultralow-threshold Raman laser using a spherical dielectric microcavity," *Nature*, 415, 621-623 (2002).
Suni, T., Henttinen, K., Suni, I. & Makinen, J., "Effects of Plasma Activation on Hydrophilic Bonding of Si and $SiO_2$," *J. Electrochem. Soc.*, 149, 6, G348-G351 (2002).
Tas, N., Sonnenberg, T., Jansen, H., Legtenberg, R. & Elwenspoek, M., "Stiction in Surface Micromachining," *J. Micromech. Microeng.*, 6, 385 (1996).
Thian, S. C. H., et al., "Micro-rapid-prototyping via multi-layered photo-lithography," *Int. J. Adv. Manuf. Technol.*, 29, 9 (2006), pp. 1026-1032.
Thienpont, H., et al., "Free-space micro-optical modules: the missing link for photonic interconnects to silicon chips," *Opto-Electronics Review*, 9, 3 (2001), pp. 238-247.
Vollmer, F., Arnold, S. & Keng, D., "Single Virus Detection From the Reactive Shift of a Whispering-Gallery Mode," *Proc. Natl. Acad. Sci. USA*, 105, 52, 20701-20704 (2008).
Weisensee, Patricia B., et al., "Hydrophobic and oleophobic re-entrant steel microstructures fabricated using micro electrical discharge machining," *J. Micromech. Microeng.*, 24, 095020 (2014) 10 pages.
Wolffenbuttel, R. F., "Low-Temperature Intermediate Au—Si Wafer Bonding; Eutectic or Silicide Bond," *Sensors and Actuators A*, 62, 680-686 (1997).
Xie, Tao et al., "Facile Tailoring of Thermal Transition Temperatures of Epoxy Shape Memory Polymers," *Polymer*, 50 (2009), pp. 1852-1856.
Xie, Tao et al., "Self-Peeling Reversible Dry Adhesive System," *Chem. Mater.*, 20 (2008), pp. 2866-2868.
Yang, Sang Yoon et al., "Elastomer Surfaces with Directionally Dependent Adhesion Strength and Their Use in Transfer Printing with Continuous Roll-to-Roll Applications," *Advanced Materials*, 24 (2012), pp. 2117-2122.
Yang, Yumi, et al., "Arrays of Silicon Micro / Nanostructures Formed in Suspended Configurations for Deterministic Assembly Using Flat and Roller-Type Stamps," *Small*, 7, 4 (2011), pp. 484-491.
Yang, Zining, et al., "Positioning errors in transfer printing-based microassembly," *J. Micro-Bio. Robot*, 12 (2017), pp. 53-64.
Zhang, Yong et al., "Autonomous Robotic Pick-and-Place of Microobjects," *IEEE Transactions on Robotics*, 26, 1 (Feb. 2010), pp. 200-207.
Zhang, Yong et al., "Micro-Masonry of MEMS Sensors and Actuators," *Journal of Microelectromechanical Systems*, 23, 2 (Apr. 2014), pp. 308-314.
Zhu, Pingan, et al., "Well-defined porous membranes for robust omniphobic surfaces via microfluidic emulsion templating," *Nat. Commun.*, 8, 15823 (2017), 10 pages.

\* cited by examiner

METHODS OF MAKING A BONDED ASSEMBLY AND A RE-ENTRANT STRUCTURE, AND METHOD OF TRANSFER PRINTING A MASKING LAYER

RELATED APPLICATIONS

The present patent document is a division of U.S. patent application Ser. No. 16/515,431, which was filed on Jul. 18, 2019, and claims the benefit of priority under 35 U.S.C. 119(e) to U.S. Provisional Patent Application No. 62/700,455, which was filed on Jul. 19, 2018. All of the aforementioned patent applications are hereby incorporated by reference in their entirety.

FEDERALLY SPONSORED RESEARCH OR DEVELOPMENT

This invention was made with government support under contract number CMMI-1351370 awarded by the National Science Foundation. The government has certain rights in the invention.

TECHNICAL FIELD

The present disclosure is related generally to microfabrication and more particularly to transfer printing and thermal joining to form bonded microassemblies.

BACKGROUND

Photolithography-based microfabrication, which includes layer by-layer target material deposition and patterning until desired structures are formed, is ubiquitous due to improved photoresists, photolithography techniques and etching methods. Currently, photolithographic resolution is in the realm of tens of nanometers, enabling the fabrication of densely-packed, high-performing two-dimensional (2D) devices. On the other hand, further advances in microfabrication towards three dimensional (3D) heterogeneous integration are becoming more challenging due to the layer-by-layer nature of photolithographic processing. Approaches such as multilayered photolithography and deep proton writing have been explored to overcome the limitations of layer-by-layer processing; however, there has been little success in terms of broad adaptation in microfabrication.

Fabricating microsystems presents a set of challenges distinct from those that exist for manufacturing macroscale devices. Chief among these challenges is the difficulty of manipulating individual objects due to vanishing body forces compared with surface forces. Owing to these challenges, monolithic microfabrication, such as layer-by-layer deposition and lithographic patterning, is commonly used to fabricate microsystems. However, these conventional approaches have substantial drawbacks for the fabrication of non-planar structures. For example, complex and lengthy process steps to selectively and precisely deposit and etch materials without damaging those already in place may be required. Even with well-crafted recipes, such fabrication methods have severe limitations in terms of producible geometries and compositions.

Modifying a surface that has a low intrinsic contact angle ($\Upsilon <90°$) to repel liquid droplets could be beneficial for a number of industrial and consumer applications. The repellency of a surface can be enhanced by forming overhang or re-entrant structures that can support liquid droplets with low surface tension. By utilizing such re-entrant structures, the contact area between the surface and the liquid may be greatly reduced to improve the repellency and lower the adhesion of liquids in the Cassie state. However, conventional methods to create re-entrant surfaces rely on expensive or time-consuming top-down approaches, such as plasma etching, electrical discharge machining, and laser cutting. In addition, typical re-entrant structures, which are based on high-aspect-ratio protrusions, may be readily damaged under external forces. Therefore, a cost-effective method to fabricate robust re-entrant surfaces would be advantageous.

BRIEF SUMMARY

A method of making a bonded polymeric assembly by transfer printing comprises contacting a stamp with a solid-phase ink comprising a photoresist to form an inked stamp, where the solid-phase ink is reversibly bound to the stamp. The inked stamp is aligned with an object comprising the photoresist and is stamped onto the object. The stamp is then removed, thereby transferring the solid-phase ink onto the object. The solid-phase ink is thermally joined with the object. Thus, a bonded polymeric assembly comprising a bonded joint between the solid-phase ink and the object is formed.

A method of making a bonded assembly by transfer printing comprises contacting a stamp with a solid-phase ink to form an inked stamp, where the solid-phase ink is reversibly bound to the stamp. The inked stamp is aligned with an object and is stamped onto the object. The stamp is then removed, thereby transferring the solid-phase ink onto the object. The solid-phase ink and the object are heated with a laser beam to effect thermal joining. Thus, a bonded assembly comprising a bonded joint between the solid-phase ink and the object is formed.

A method of fabricating a re-entrant structure by transfer printing comprises contacting a stamp with a solid-phase ink comprising a polymer to form an inked stamp, where the solid-phase ink includes an array of through-thickness holes and is reversibly bound to the stamp. The inked stamp is aligned with an object comprising a polymer and is stamped onto the object. The stamp is then removed, thereby transferring the solid-phase ink onto the object. The solid-phase ink is oriented on the object so as to comprise a suspended portion not supported by the object that includes the array of through-thickness holes. The solid-phase ink is thermally joined with the object. Thus, a re-entrant structure comprising the suspended portion and including a bonded joint is formed.

A method of transfer printing a masking layer comprises contacting a stamp with a solid-phase ink comprising a polymer to form an inked stamp, where the solid-phase ink is reversibly bound to the stamp. The inked stamp is aligned with a target substrate and is stamped onto the target substrate. The stamp is then removed, thereby transferring the solid-phase ink comprising the polymer onto the target substrate to form a masking layer of a predetermined pattern. The target substrate includes one or more unmasked portions not covered by the masking layer. The one or more unmasked portions of the target substrate are processed, and then the masking layer is removed.

DETAILED DESCRIPTION

A microassembly technique—termed "micro-Lego"—which involves transfer printing of individual microscale building blocks ("solid-phase inks") followed by thermal joining without any intermediate adhesive has been developed for 3D microfabrication. The microassembly method typically utilizes a microstructured polymeric stamp to achieve a high adhesion on/off ratio, which facilitates printing of solid-phase inks onto virtually any surface without additional adhesive layers. After transfer printing, the solid-phase inks may be permanently joined via thermal processing. As demonstrated in this disclosure, the capability of micro-Lego can be extended to construct practical 3D objects and devices, such as robust cantilever structures and re-entrant surfaces capable of repelling liquid droplets. In addition, the microassembly technique may be used to assemble and join photoresist-based solid-phase inks to obtain structures not achievable with conventional photolithographic processing, such as the cantilever and re-entrant structures mentioned above and masking layers on nonuniform surfaces. Finally, a rapid, laser-based approach may be employed for thermal joining, rendering the microassembly method capable of high-throughput additive manufacturing.

Figures 1A, 1B, 1C:
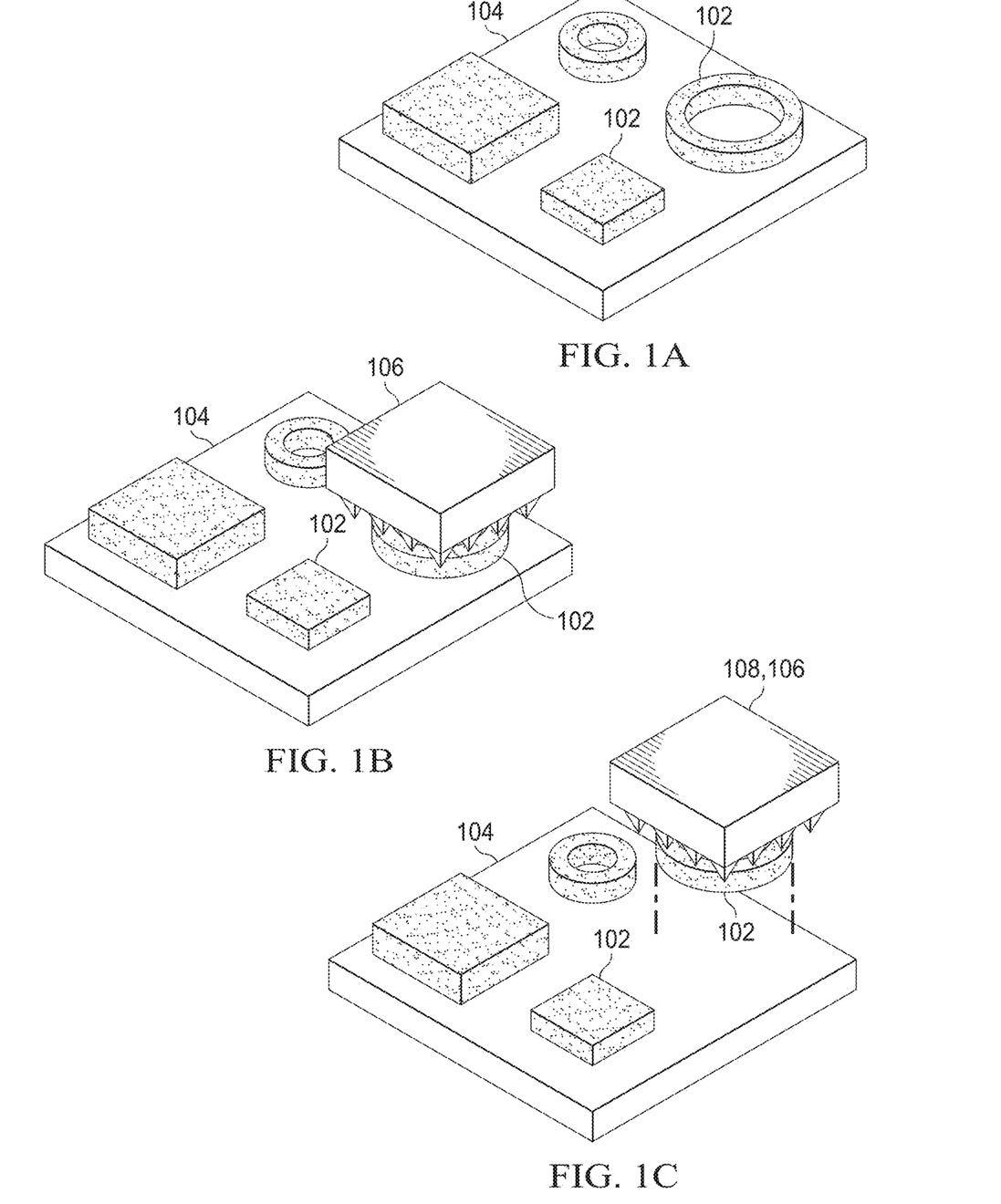
FIGS. 1A-1E show exemplary steps in transfer printing a solid-phase ink onto an object, followed by thermal joining to form a bonded assembly. In this example, the solid-phase

FIGS. 1A-1E show an exemplary method to prepare a bonded polymeric assembly by transfer printing and thermal joining of solid-phase inks. FIG. 1A illustrates several solid-phase inks 102 of arbitrarily chosen shapes supported by a donor substrate 104 and ready for microassembly. In this example, each of the solid-phase inks 102 comprises a photoresist. Preparation of the solid-phase inks 102 for easy retrieval from the donor substrate 104 takes place prior to transfer printing, as described below.

Figure 1D:
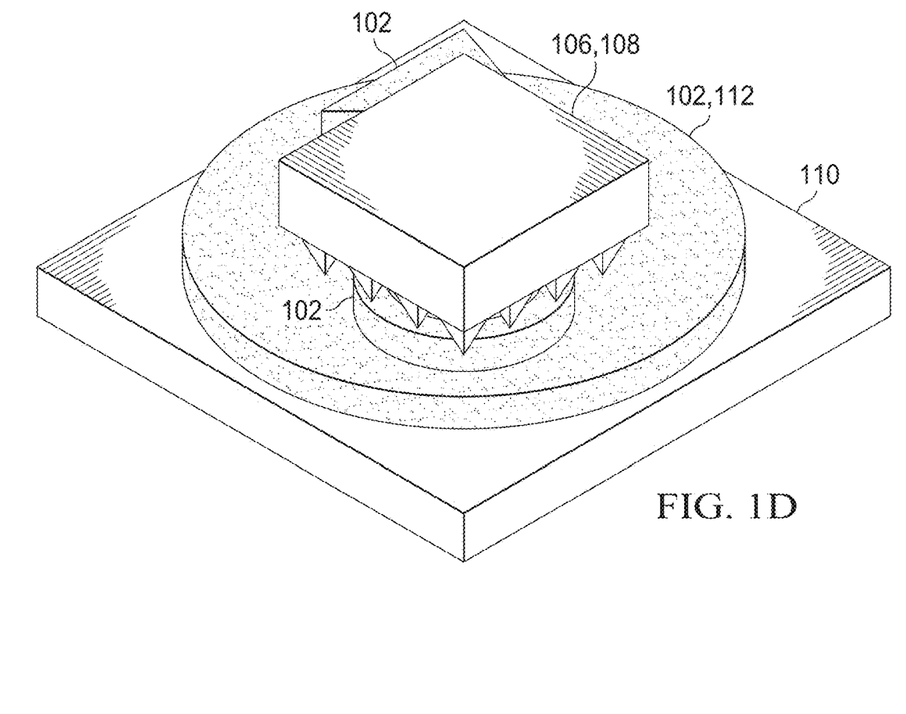

Referring to FIGS. 1B and 1C, the method comprises contacting a stamp 106 with a solid-phase ink 102 comprising a photoresist to form an inked stamp 108. The stamp 106 is capable of reversible binding of the solid-phase ink 102. The inked stamp 108 (i.e., the stamp 106 with the solid-phase ink 102 reversibly bound to the stamp 106) is removed from the donor substrate 104 and aligned with an object 112, which may be disposed on a receiving substrate 110. The motion of the stamp 106 may be controlled manually or automatically, such as with a motion controller. The object 112 may be a previously deposited or printed solid-phase ink 102, or the object 112 may be the receiving substrate 110. In this example, the object 112 also comprises the photoresist. As shown in FIG. 1D, the inked stamp 108 is stamped onto the object 112. Upon removal of the stamp 106, the solid-phase ink 102 remains on the object 112, thereby completing transfer printing of the solid-phase ink 102.

Figure 1E:
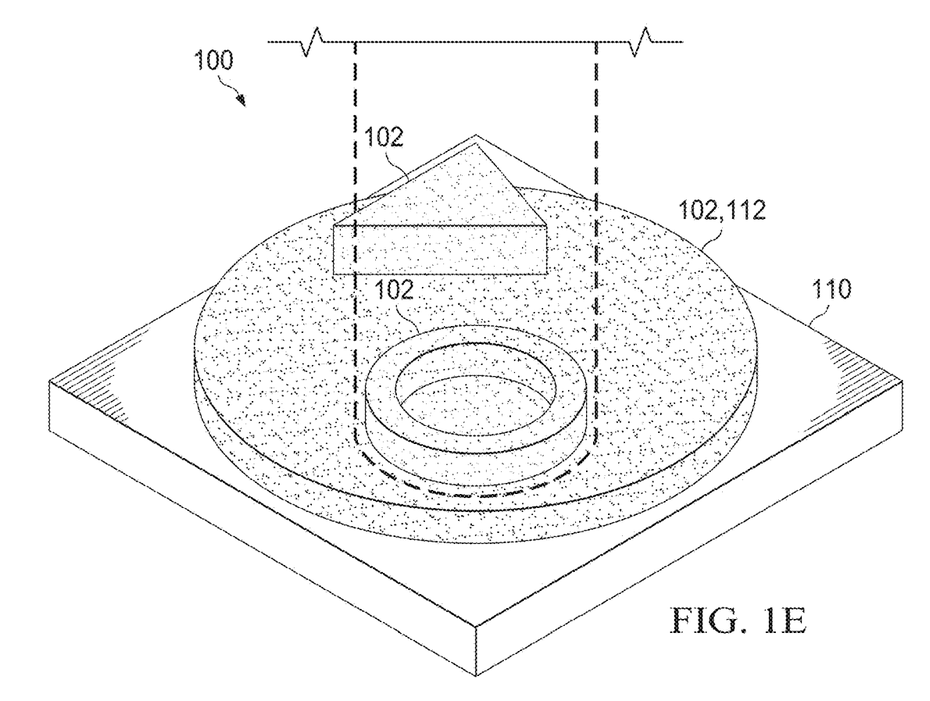

Referring to FIG. 1E, during or after transfer printing, the solid-phase ink 102 is thermally joined with the object 112. In other words, before or after removal of the stamp 106, the solid-phase ink 102 and the object 112 are heated to effect bonding at an interface therebetween, forming a bonded joint 118. In the example of FIG. 1E, thermal joining of the solid-phase ink 102 and the object 112 is effected by laser heating, typically after removing the stamp 106.

Generally speaking, thermal joining may occur when the interface between the solid-phase ink 102 and the object 112, each comprising a photoresist, reaches a temperature sufficient for bonding, such as a temperature in a range from about 120° C. to about 180° C. Thermal joining may be carried out using conductive, convective and/or radiant heating. For example, thermal joining may be carried out in a furnace or while the receiving substrate is adjacent to or on a heat source, such as a hot plate. Alternatively, as described above, the heating may be localized by employing a laser beam or a heat gun. Besides localization, an advantage of laser heating is speed. Using a hot plate or furnace, thermal joining may be effected within a period of minutes (e.g., from 1 min to 60 min, or more typically from 10 min to about 30 min). In contrast, using a laser beam, such as a laser beam generated by a pulsed laser, thermal joining may occur almost instantaneously (e.g., in a time period of less than one second, such as 500 ms or less, or 1 ms or less). Due to the pulse duration of commercially available pulsed lasers, the time period for thermal joining is typically at least 1 ps, or at least 1 ns. In response to the laser pulse, the solid-phase ink 102 and the object 112 may experience an extremely rapid rise and fall in temperature, yielding a strong interfacial bond (bonded joint 118). It is known that the photoresist SU-8 strongly absorbs light having a wavelength around 300 nm. Accordingly, it may be beneficial to employ a laser wavelength in a range from about 200 nm to about 400 nm for the laser heating. Advantageously, no external pressure is required during thermal joining.

Thus, a bonded polymeric assembly 100 including a bonded joint 118 between the solid-phase ink 102 and the object 112 may be formed. Preferably, the bonded joint may exhibit an interfacial joining strength of at least about 0.9 J/m². Like the solid-phase ink 102 and the object 112, the bonded polymeric assembly 100 may comprise a photoresist. The photoresist may be an epoxy-based photoresist. Since solidification or crosslinking of the photoresist may be carried out during fabrication of the solid-phase ink 102 (prior to transfer printing and joining to form the bonded assembly 100), the photoresist may be described as a crosslinked photoresist. Examples of suitable photoresists may include negative or positive photoresists, such as SU-8, KMPR, UVN™, ma-N, and/or polyimide. The joining strength of a thermally joined SU-8 interface has been examined experimentally through nanoindentation tests and numerical analysis, as described in the Examples below.

The method may further include repeating the contacting, aligning, stamping, removing, and (optionally) the thermal joining to deposit additional solid-phase ink(s) and form a bond with the underlying object, which may be a previously deposited solid-phase ink. It is understood that one sequence of contacting, aligning, stamping, and removing constitutes a single transfer printing step. In one approach, thermal joining may be carried out only after multiple transfer printing steps to attain the desired arrangement of solid-phase inks. In another approach, thermal joining may be carried out multiple times, e.g., after each sequence of contacting, aligning, stamping, and removing. The bonded polymeric assembly 100 may include at least two of the solid-phase inks 102 stacked on a receiving substrate 110, as shown schematically in FIG. 1E.

Figures 2A, 2B:
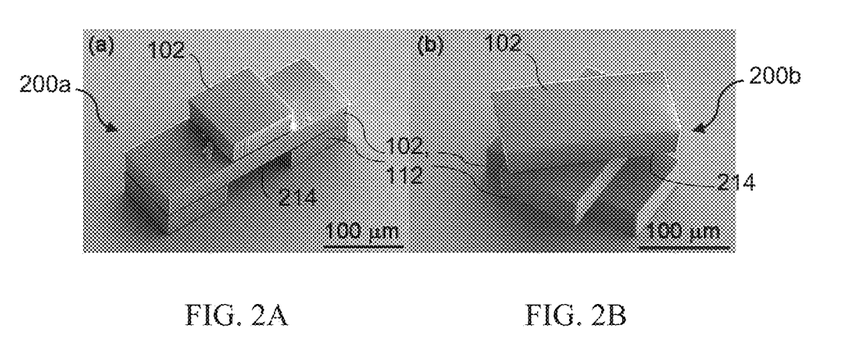
FIGS. 2A and 2B show scanning electron microscope (SEM) images of a bonded polymeric assembly comprising a photoresist that includes an overhanging or suspended portion.
Figure 3:
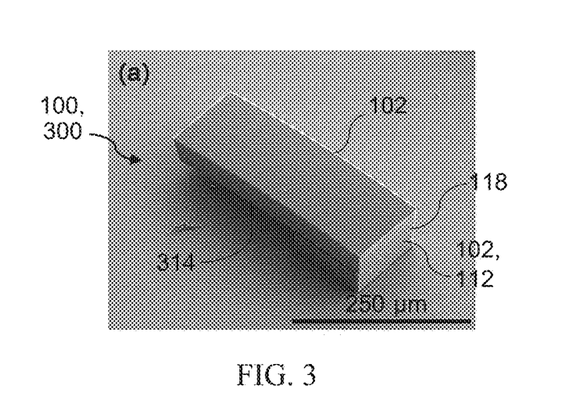
FIG. 3 is an SEM image of a bonded polymeric assembly comprising a cantilever structure.
Figure 4:
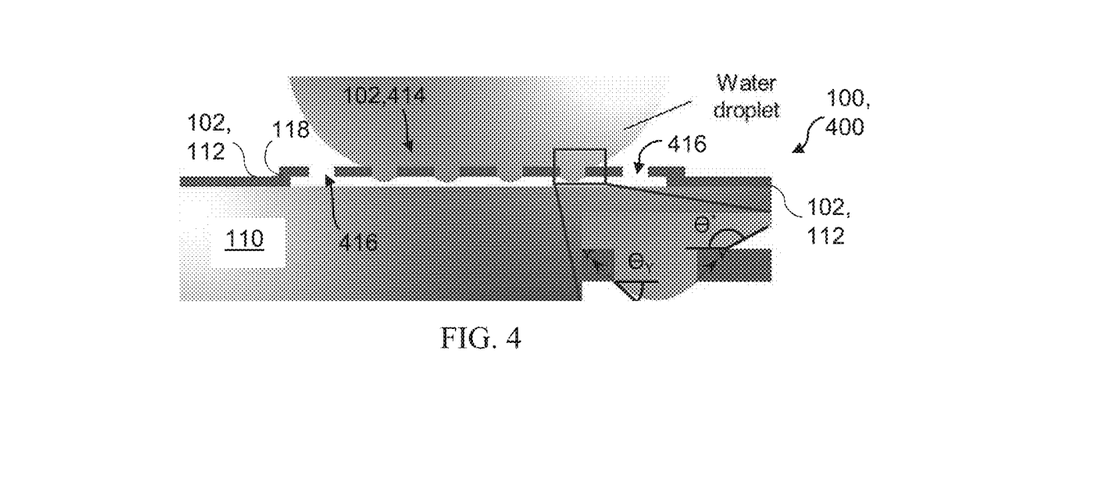
FIG. 4 is a schematic of a bonded polymeric assembly comprising a re-entrant structure.

Depending on the arrangement of the solid-phase inks 102, the bonded polymeric assembly 100 may include an overhanging or suspended portion or another 3D geometry that is difficult or impossible to fabricate using conventional photolithographic patterning. FIGS. 2A and 2B are scanning electron microscope (SEM) images of 100 µm×100 µm and 100 µm×300 µm SU-8 inks that have been transfer printed and thermally joined. Each of the resulting bonded polymeric assemblies 100 comprises a monolithic structure 200a,200b that includes at least one suspended portion 214. As would be recognized by the skilled artisan, the term "suspended portion" refers to a part of the bonded polymeric assembly that is physically unsupported by another structure (e.g., an object, a previously deposited ink, the receiving substrate). As described in greater detail in the examples below, the bonded polymeric assembly 100 may comprise a cantilever structure 300 with an extended suspended portion 314, as shown for example in FIG. 3. In another example, as shown in FIG. 4, the bonded polymeric assembly 100 may comprise a re-entrant structure 400, where the central suspended portion 414 provides a low wettability surface for a liquid droplet. In this example, upon removal of the stamp and transfer of the solid-phase ink 102 to the object 112, the solid-phase ink 102 may be oriented on the object 112 so as to include a suspended portion 414 not supported by the object 112 that includes an array of through-thickness holes 416. Upon thermally joining the solid-phase ink 102 with the object 112, a re-entrant structure 400 comprising the suspended portion 414 and including a bonded joint 118 may be formed.

The stamp employed for transfer printing may include a polymeric material comprising a shape memory polymer or an elastomer, such as polydimethylsiloxane (PDMS). Suitable stamps are described in, for example, U.S. Pat. No. 9,412,727, issued Aug. 9, 2016, and U.S. Pat. No. 10,046,353, issued Aug. 14, 2018, both of which are hereby incorporated by reference in their entirety.

In another embodiment of the method, a bonded assembly may be fabricated by transfer printing utilizing a solid-phase ink and an object comprising the same or different materials (which may or may not comprise a photoresist), followed by thermal joining carried out with laser heating to facilitate rapid fabrication. As described above in reference to FIGS. 1B and 1C, a stamp 106 is contacted with a solid-phase ink 102 to form an inked stamp 108, where the solid-phase ink 102 is reversibly bound to the stamp 106. In this embodiment, however, the solid-phase ink 102 may comprise any material, such as a polymer, metal or alloy, ceramic, or semiconductor. The inked stamp 108 (i.e., the stamp 106 with the solid-phase ink 102 reversibly bound to the stamp 106) is removed from the donor substrate and aligned with an object 112 for transfer printing. The object 112 may comprise any material, such as a polymer, metal or alloy, ceramic, or semiconductor, which may be the same as or different from that of the solid-phase ink 102. The object 112 may be a previously deposited solid-phase ink 102 or a receiving substrate 110. As shown in FIG. 1D, the inked stamp 108 is stamped onto the object 112. Upon removal of the stamp 106, the solid-phase ink 102 remains on the object 112, thereby completing transfer printing.

Referring to FIG. 1E, during or after transfer printing, the solid-phase ink 102 is thermally joined with the object 112. In other words, before or after removal of the stamp 106, the solid-phase ink 102 and the object 112 are heated to effect bonding at an interface therebetween, forming a bonded joint 118. As illustrated in FIG. 1E, thermal joining of the solid-phase ink 102 and the object 112 is effected by laser heating, typically after removing the stamp 106. Laser heating may be carried out with a laser beam, which may be generated by a pulsed laser. Generally speaking, thermal joining may occur when the interface between the solid-phase ink 102 and the object 112 reaches a temperature sufficient for bonding. In the case of a polymer, such as a photoresist, the temperature may be in the range from about 120° C. to about 180° C. With laser heating, as described above, thermal joining may occur almost instantaneously, such as in a time period of less than one second (e.g., 500 ms or less, or 1 ms or less). Due to the pulse duration of commercially available pulsed lasers, the time period for thermal joining is typically at least 1 ps, or at least 1 ns. In response to the laser pulse, the solid-phase ink 102 and the object 112 may experience an extremely rapid rise and fall in temperature, yielding a strong interfacial bond (bonded joint 118). A laser wavelength which is strongly absorbed by the material(s) of the solid-phase ink and the object may be selected for laser heating. Advantageously, as described above, no external pressure is required during thermal joining.

Figure 5:
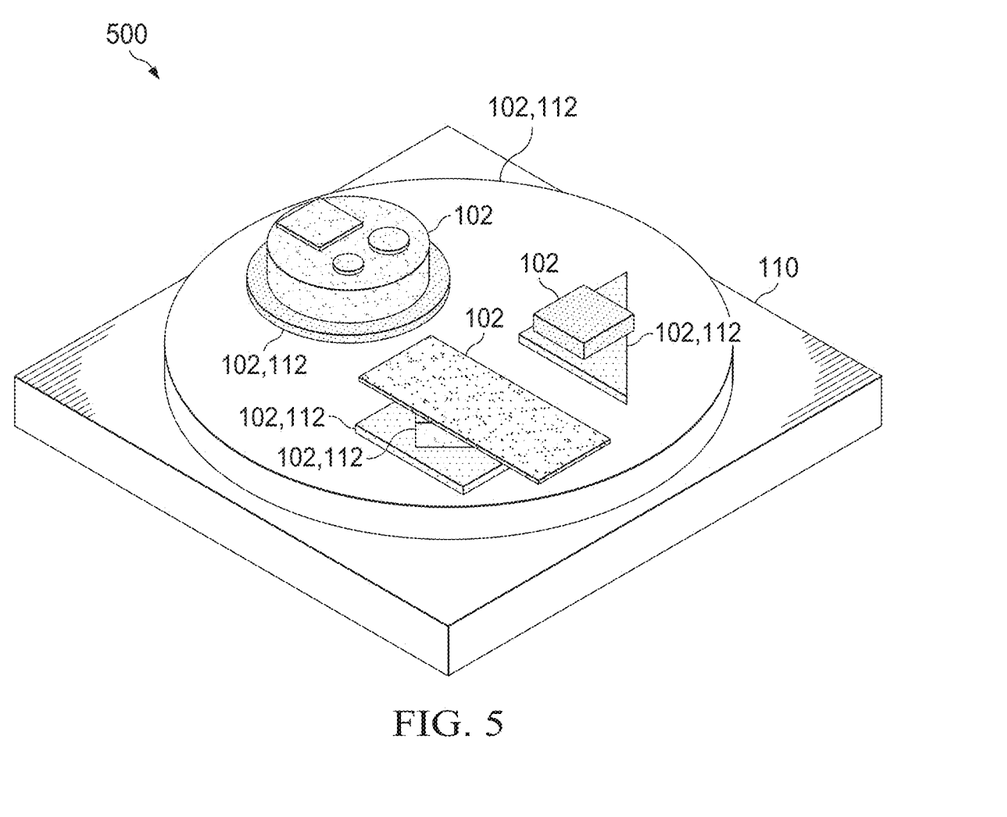
FIG. 5 is a schematic of a bonded assembly having a composite structure, where the solid-phase ink(s) and the object(s) comprise different materials.

Thus, a bonded assembly 100 including a bonded joint 118 between the solid-phase ink 102 and the object 112 may be formed. If the solid-phase ink 102 and the object 112 comprise the same material, then the bonded assembly 100 may be a monolithic structure comprising the material, as described above. For example, if the ink 102 and the object 112 comprise a polymer, a bonded polymeric assembly 100 having a monolithic structure 200a,200b comprising the polymer may be formed upon bonding, as shown for example in FIGS. 2A and 2B. If the solid-phase ink 102 and the object 112 comprise different materials, then the bonded assembly 100 may be a composite structure 500 comprising the different materials, as shown for example in FIG. 5. Advantageously, in either case, the bonded joint may exhibit an interfacial joining strength of at least about 0.9 J/m$^2$.

The method may further include repeating the contacting, aligning, stamping, removing, and (optionally) the thermal joining to deposit additional solid-phase ink(s) and form a bond with the underlying object, which may be a previously deposited solid-phase ink. As set forth above, one sequence of contacting, aligning, stamping, and removing constitutes a single transfer printing step. In one approach, thermal joining may be carried out only after multiple transfer printing steps to attain the desired arrangement of solid-phase inks. In another approach, thermal joining may be carried out multiple times, e.g., after each sequence of contacting, aligning, stamping, and removing.

The bonded assembly 100 may include at least two of the inks 102 stacked on a receiving substrate 110. As indicated above, the bonded assembly may be a monolithic structure comprising a single material or composite structure comprising multiple (different) materials. Depending on the arrangement of the solid-phase inks 102, the bonded assembly may include an overhanging or suspended portion or another 3D geometry that is difficult or impossible to fabricate using conventional photolithographic patterning. As described above, the bonded assembly 100 may comprise a cantilever structure 300 or a re-entrant structure 400 for repelling liquid droplets, as shown in FIGS. 3 and 4, respectively.

Figure 6A:
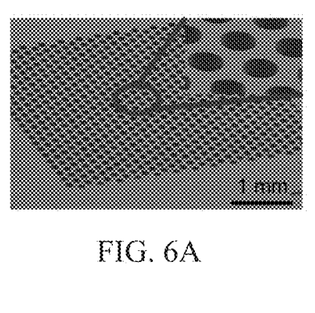
FIGS. 6A and 6B are SEM images of fabricated re-entrant structures.
Figure 6B:
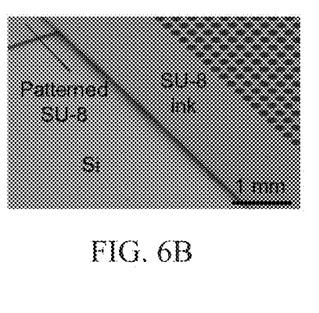

The re-entrant structure 400, which comprises a first object disposed on and bonded to a second object, where each of the first and second objects comprises a polymer, may be fabricated according to either embodiment of the method described above. The first object is oriented on the second object so as to include a suspended portion not supported by the second object, and the suspended portion includes an array of through-thickness holes, as illustrated in FIGS. 4, 6A and 6B. The first and second objects may comprise solid-phase inks 102 transfer printed onto a substrate 110, followed by thermal joining (e.g., carried out by laser heating) to form a bonded joint 118 between the first and second objects. As can be seen in FIGS. 6A and 6B, the first object ("SU-8 ink") may include a solid border extending around all or part of the array of through-thickness holes, and the bonded joint may comprise the solid border of the first object and an underlying portion of the second object. The bonded joint between the first and second objects (labeled "SU-8 ink" and "Patterned SU-8") may have an interfacial joining strength of at least about 0.9 J/m$^2$.

Figure 7A:
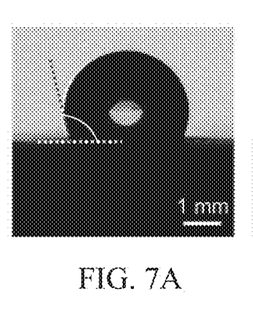
FIGS. 7A and 7B show, respectively, a water droplet on a re-entrant surface comprising a photoresist, fabricated as described in this disclosure, and a water droplet on a flat surface comprising the same photoresist.
Figure 7B:
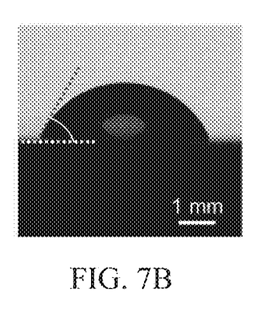

When exposed to a liquid droplet, the re-entrant structure 400 may repel the liquid droplet with an apparent contact angle of at least about 90°, and in some cases the apparent contact angle may be at least about 105°, as shown for example in FIG. 7A for an exemplary SU-8 re-entrant structure holding a water droplet. For comparison, a water droplet on a SU-8 flat surface with a much smaller apparent contact angle is shown in FIG. 7B. Measurement of the apparent contact angle is illustrated in the figures and is discussed theoretically below.

In the example of FIGS. 6A and 6B, the polymer comprises a photoresist, specifically, SU-8. Generally speaking, the photoresist may be selected from: SU-8, KMPR, UVN™, ma-N, and polyimide. The first object may comprise the same or a different polymer as the second object. The polymer may comprise an intrinsic contact angle of at least about 90°; in other words, the polymer may be hydrophobic. Alternatively, the polymer may comprise an intrinsic contact angle of less than 90°; in other words, the polymer may be hydrophilic. The intrinsic contact angle may be less than 80°. Accordingly, the apparent contact angle may be at least about 25% larger than an intrinsic contact angle of the polymer.

A method of fabricating the re-entrant structure may comprise contacting a stamp with a solid-phase ink comprising a polymer to form an inked stamp, where the solid-phase ink includes an array of through-thickness holes and is reversibly bound to the stamp. The inked stamp may be aligned with an object comprising a polymer, and the inked stamp may be stamped onto the object. When the stamp is removed, the solid-phase ink may be transferred onto the object, and the solid-phase ink may be oriented on the object so as to include a suspended portion not supported by the object, where the suspended portion includes the array of through-thickness holes. The solid-phase ink may be thermally joined with the object, thereby forming a re-entrant structure comprising the suspended portion and including a bonded joint. The thermal joining may be carried out using any approach described herein, such as laser heating. The stamp, re-entrant structure, polymer, solid-phase ink, object and bonded joint may have any of the characteristics described above or elsewhere in this disclosure.

Also described in this disclosure is a method of transfer printing a masking layer, which may be understood in reference to FIGS. 9A-9F. The method comprises contacting a stamp 106 with a solid-phase ink 102 comprising a polymer to form an inked stamp 108, where the solid-phase ink 102 is reversibly bound to the stamp 106, and aligning the inked stamp 108 with a target substrate 110. The target substrate 110 may comprise a semiconductor wafer. As described above, the polymer may be a photoresist such as SU-8, KMPR, UVN™, ma-N, and/or polyimide. The inked stamp 108 is stamped onto the target substrate 110, and the stamp 106 is removed, thereby transferring the solid-phase ink 102 comprising the polymer onto the target substrate 110 to form a masking layer 120 of a predetermined pattern on the target substrate 110. The method may include multiple steps of transferring the solid-phase ink onto the target substrate 110, such that the contacting, aligning, stamping, and removing are repeated in order to form the masking layer 120. Thermal joining using a localized heat source, such as a laser beam as described above, may allow the solid-phase inks 102 to be bonded to each other to form a robust masking layer 120 of the desired pattern without bonding the masking layer 120 to the target substrate 110.

The target substrate 110 includes one or more unmasked portions 122 not covered by the masking layer 120. The target substrate 110 may include one or more trenches, bumps or other surface features that inhibit spin-casting of photoresist. The one or more unmasked portions 122 of the target substrate 110 may undergo processing, and, after the processing, the masking layer 120 may be removed. The processing of the one or more unmasked portions 122 of the target substrate 110 may include material deposition and/or etching. The removal of the masking layer 120 may take place using one of a number of different approaches. In one example, the removal may entail contacting the masking layer with the stamp, such that the masking layer is reversibly bound to the stamp, and the stamp may be withdrawn to remove the masking layer from the target substrate. Using this approach, a portion or an entirety of the masking layer may be removed in a single step. In another example, removing the masking layer may comprise applying a removal liquid, such as developer or acetone, to the target substrate. In yet another example, the masking layer may be removed by employing a pressure-sensitive adhesive to peel off the masking layer.

EXAMPLES

Fabrication of SU-8 Solid-Phase Inks

Figure 8A:
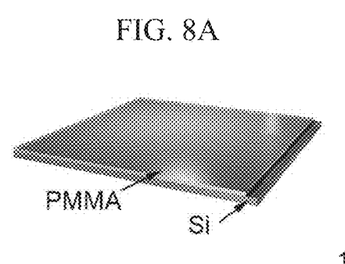
FIGS. 8A-8D are schematics illustrating fabrication of solid-phase inks comprising a photoresist such as SU-8.
Figure 8B:
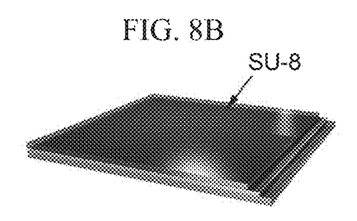
Figure 8C:
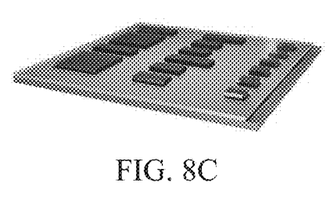
Figure 8D:
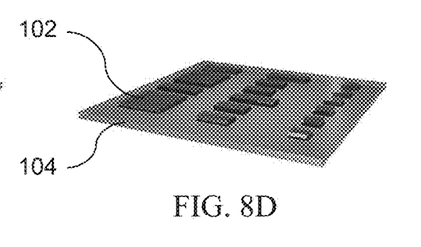

The process may begin with preparation of a donor substrate, as shown schematically in FIGS. 8A-8D. The donor substrate includes in this example an array of microscale SU-8 inks. The solid-phase inks exhibit negligible adhesion with the donor substrate to facilitate easy retrieval. Referring to FIG. 8A, polymethylmethacrylate (PMMA) is spin coated at 3000 rpm on a Si substrate and cured at 150° C. for 1 min. Subsequently, SU-8 50 is coated onto the PMMA at 3000 rpm, as shown in FIG. 8B, and photolithographically patterned, as shown in FIG. 8C and hard baked (heated) at 110° C. for 1 h. Here, sufficient baking can fully cure (crosslink) the SU-8 inks and terminate epoxy chains that are utilized in micro-Lego for permanent joining, while insufficient baking may leave the SU-8 inks prone to damage during the PMMA removal step. The fully cured or crosslinked SU-8 inks are submerged in an acetone bath to remove the PMMA, which engenders the SU-8 inks merely placed on the Si substrate with weak surface interaction, as illustrated in FIG. 8D.

Transfer Printing and Joining of SU-8 Inks

Figure 9A:
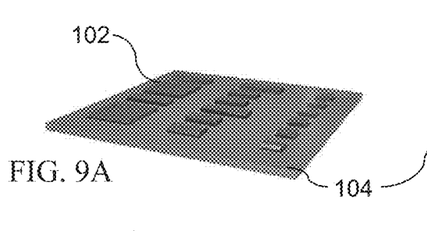
FIGS. 9A-9F are schematics illustrating transfer printing of solid-phase inks comprising a photoresist such as SU-8.
Figure 9B:
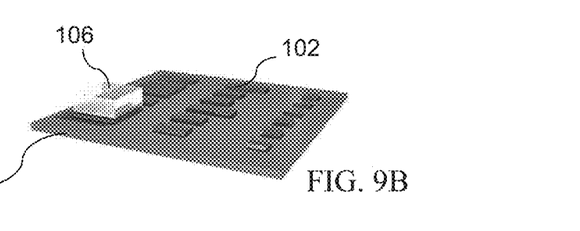
Figure 9C:
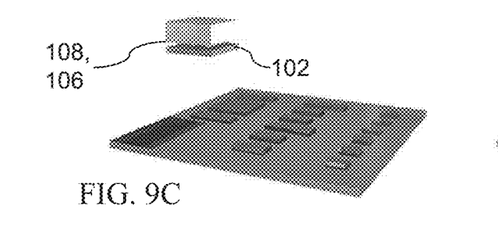
Figures 9D, 9F:
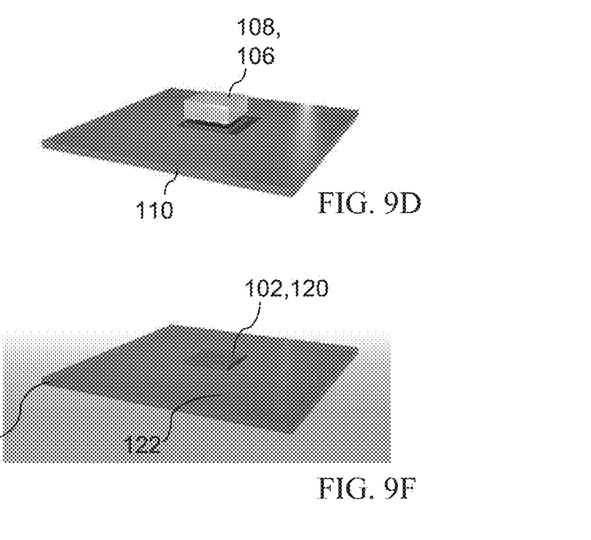
Figure 9E:
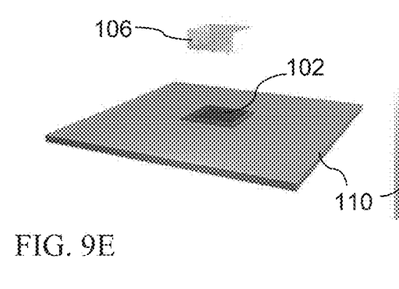

Referring again to the schematics of FIGS. 9A and 9B, the prepared SU-8 ink 102 may be brought into contact with a polydimethylsiloxane (PDMS) stamp that features multiple microtips for an enhanced adhesion on/off ratio. Rapid retrieval of the stamp 106 after a high preloading allows for reversible binding of the SU-8 ink, as illustrated in FIG. 9C. The inked stamp 108 may then delivered to a target location on a Si receiving substrate 110 and brought into contact with the printing surface, as shown in FIG. 9D. The stamp 106 may be subsequently retracted slowly, as shown in FIG. 9E, which results in release and printing of the SU-8 ink 102 onto the target location, as illustrated in FIG. 9F. Since the printed SU-8 ink 102 typically adheres to the surface 110 underneath by weak van der Waal's interaction, delicate handling may be advisable prior to permanent joining. Transfer printing is repeated with additional SU-8 ink(s) until a desired structure is constructed, and may be followed by thermal joining. In one experimental example, thermal processing takes place at 150° C. for 1 h utilizing a hot plate disposed underneath the Si receiving substrate.

Fabrication of Cantilever Structure

Transfer printing and joining is employed to form a SU-8 cantilever beam specimen for nanoindenter tests. The material of choice for SU-8 inks is SU-8 50, which yields ~40 μm thickness (t) film upon 3000 rpm spin coating. A 100 μm by 100 μm square ink is first transfer printed onto a Si substrate and a 100 μm by 300 μm rectangular ink is transfer printed with precise alignment such that a 200 μm long beam is suspended on a 100 μm by 100 μm spacer. The transfer printed SU-8 inks are joined at 150° C. to finalize the construction of the cantilever specimen as shown in FIG. 3.

The mechanical joining strength at the joining interface may be quantified by investigating the energy release rate, which refers to the amount of energy required for a crack to grow a unit length based on linear elastic fracture mechanics, as described in U.S. Provisional Patent Application No. 62/700,455, the priority application for this disclosure, which was incorporated by reference above. Adopting the tensile stress from finite element analysis in conjunction with 1 μm of crack tip length, an energy release rate of 0.992 J/m$^2$ (about 1 J/m$^2$) is calculated.

Fabrication of Re-Entrant Structure

Figures 10A, 10B:
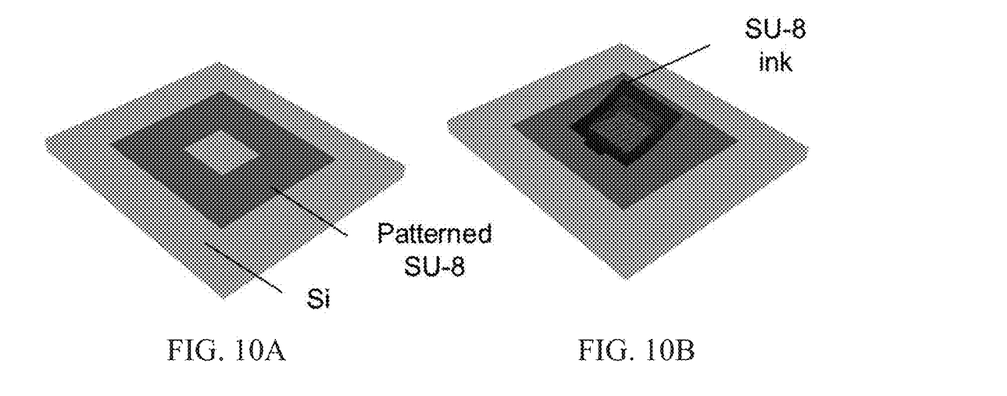
FIGS. 10A and 10B show steps in fabricating the re-entrant structure of FIGS. 6A and 6B, where in FIG. 10A an exemplary photoresist (SU-8) layer is photolithographically patterned on a silicon substrate; and in FIG. 10B a SU-8 ink with a circular hole array is separately patterned on a donor substrate and assembled on the patterned SU-8 layer.

In this example, the fabrication process of a SU-8 re-entrant structure (or re-entrant surface) starts with photolithographic patterning of a SU-8 layer on a Si substrate. SU-8 50 is spin coated at 3000 rpm to obtain a 40 μm thick SU-8 layer. Following exposure with a photomask and development, a 4 mm square trench pattern that is used as cornerstone of the SU-8 re-entrant structure is constructed, as shown in FIG. 10A. A 6 mm square SU-8 ink with an array of circular holes of 125 μm in diameter is separately fabricated as described above. Subsequently, micro-Lego is conducted to assemble the prepared SU-8 ink on the patterned SU-8 layer, as illustrated in FIG. 10B. Thermal processing to join the patterned SU-8 layer and the transfer printed SU-8 ink on a hot plate at 150° C. completes the fabrication of a SU-8 re-entrant structure. FIGS. 6A and 6B show SEM images of the assembled SU-8 re-entrant structure. There is an approximately 40 μm gap between the assembled SU-8 ink and the Si surface, which enables the SU-8 re-entrant structure to repel a liquid droplet, as illustrated in FIG. 4. Wetting characteristics of the SU-8 re-entrant surface are examined using a goniometer after placing a 3 μl water droplet on it.

In order for a surface with a low intrinsic contact angle (Y<90°) to repel a liquid droplet, the surface may require features—a re-entrant topology—to suspend the droplet. The re-entrant topology can suspend the liquid due to the formation of upward surface tension (Y) over the liquid meniscus as indicated in the inset image of FIG. 4. On the re-entrant structure, a base of droplet contacts the solid and gas simultaneously. If the liquid-solid contact fraction (f) is small enough, the apparent contact angle of a liquid droplet (θ*) becomes larger than 90° and the surface starts to repel the liquid. Assuming an ideally flat liquid-solid contact surface and negligible meniscus curvature, the apparent contact angle θ* of a suspended droplet can be calculated by Cassie-Baxter equation as below:

$$\cos \theta^* = f(\cos \theta_Y + 1) - 1$$

According to the SU-8 re-entrant surface design in this example, f is 0.56 and the Y of the flat SU-8 surface is measured as 73±5° (FIG. 7B). From the above equation, the theoretical θ* can be calculated as 106° which is similar to the measured θ* on the SU-8 re-entrant surface (118±5°) (FIG. 7A). The disparity between theoretical and experimental values can be explained by the relatively thick sidewall of the holes in the SU-8 ink compared to its circular hole diameter. The thick sidewall causes enlarged liquid-solid contact area as well as droplet pinning around circular holes. Conventional re-entrant surfaces are composed of a protruded pillar array with a high aspect ratio, which inherently is fragile under external abrasion or forces. In this context, the demonstrated SU-8 re-entrant structure is fabricated from a single continuous single film that is more robust to external perturbations.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A re-entrant structure for repelling liquid droplets, the re-entrant structure comprising:
    a first object disposed on and bonded to a second object at a bonded joint between the first and second objects, each of the first and second objects comprising a polymer, the first object being oriented so as to include a suspended portion not supported by the second object, the suspended portion including an array of through-thickness holes,
    wherein, when exposed to a liquid droplet, the re-entrant structure repels the liquid droplet with an apparent contact angle of at least about 90°.

2. The re-entrant structure of claim 1, wherein the apparent contact angle is at least about 105°.

3. The re-entrant structure of claim 1, wherein the apparent contact angle is at least about 25% larger than an intrinsic contact angle of the polymer.

4. The re-entrant structure of claim 3, wherein the intrinsic contact angle of the polymer is at least about 90°.

5. The re-entrant structure of claim 3, wherein the intrinsic contact angle of the polymer is less than 90°.

6. The re-entrant structure of claim 1, wherein the polymer comprises a photoresist.

7. The re-entrant structure of claim 6, wherein the photoresist comprises SU-8.

8. The re-entrant structure of claim 1, wherein the polymer of the first object is the same as that of the second object.

9. The re-entrant structure of claim 1, wherein the polymer of the first object is different from that of the second object.

10. The re-entrant structure of claim 1, wherein the first object includes a solid border extending around all or part of the array of through-thickness holes, and wherein the bonded joint includes the solid border and an underlying portion of the second object.

11. The re-entrant structure of claim 1, wherein the first and second objects comprise first and second solid-phase inks, and wherein the re-entrant structure is formed by transfer printing the first and second solid-phase inks onto a substrate, followed by thermal joining to form the bonded joint.

12. A re-entrant structure for repelling liquid droplets, the re-entrant structure comprising:
a first object disposed on and bonded to a second object at a bonded joint between the first and second objects, each of the first and second objects comprising a polymer, the first object being oriented so as to include a suspended portion not supported by the second object, the suspended portion including an array of through-thickness holes,
wherein the polymer comprises a photoresist.

13. The re-entrant structure of claim 12, wherein the photoresist comprises SU-8.

14. The re-entrant structure of claim 12, wherein, when exposed to a liquid droplet, the re-entrant structure repels the liquid droplet with an apparent contact angle of at least about 90°.

15. The re-entrant structure of claim 14, wherein the apparent contact angle is at least about 105°.

16. The re-entrant structure of claim 14, wherein the apparent contact angle is at least about 25% larger than an intrinsic contact angle of the polymer.

17. The re-entrant structure of claim 16, wherein the intrinsic contact angle of the polymer is at least about 90°.

18. The re-entrant structure of claim 16, wherein the intrinsic contact angle of the polymer is less than 90°.

19. The re-entrant structure of claim 12, wherein the polymer of the first object is the same as that of the second object.

20. The re-entrant structure of claim 12, wherein the polymer of the first object is different from that of the second object.

21. The re-entrant structure of claim 12, wherein the first object includes a solid border extending around all or part of the array of through-thickness holes, and wherein the bonded joint includes the solid border and an underlying portion of the second object.

22. The re-entrant structure of claim 12, wherein the first and second objects comprise first and second solid-phase inks, and wherein the re-entrant structure is formed by transfer printing the first and second solid-phase inks onto a substrate, followed by thermal joining to form the bonded joint.

* * * * *